US010225922B2

(12) United States Patent
Mu et al.

(10) Patent No.: US 10,225,922 B2
(45) Date of Patent: Mar. 5, 2019

(54) PCB BASED SEMICONDUCTOR PACKAGE WITH IMPEDANCE MATCHING NETWORK ELEMENTS INTEGRATED THEREIN

(71) Applicant: Infineon Technologies AG, Neubiberg (DE)

(72) Inventors: Qianli Mu, San Jose, CA (US); Cristian Gozzi, Santa Clara, CA (US); Asmita Dani, San Jose, CA (US)

(73) Assignee: Cree, Inc., Durham, NC (US)

( * ) Notice: Subject to any disclaimer, the term of this patent is extended or adjusted under 35 U.S.C. 154(b) by 252 days.

(21) Appl. No.: 15/046,923

(22) Filed: Feb. 18, 2016

(65) Prior Publication Data
US 2017/0245359 A1    Aug. 24, 2017

(51) Int. Cl.
*H01L 21/60* (2006.01)
*H05K 1/02* (2006.01)
(Continued)

(52) U.S. Cl.
CPC .......... *H05K 1/0213* (2013.01); *H01L 23/13* (2013.01); *H01L 23/498* (2013.01); *H01L 23/49822* (2013.01); *H01L 23/49844* (2013.01); *H01L 23/66* (2013.01); *H05K 1/024* (2013.01); *H05K 1/025* (2013.01); *H05K 1/0243* (2013.01); *H05K 1/0298* (2013.01); *H05K 1/0366* (2013.01);
(Continued)

(58) Field of Classification Search
CPC ....... H01L 2924/00; H01L 2924/00014; H01L 2224/48227; H01L 2224/73265; H01L 2924/3011
See application file for complete search history.

(56) References Cited

U.S. PATENT DOCUMENTS 3,986,196 A    10/1976  Decker et al.
5,067,004 A *  11/1991  Marshall ................. H01L 23/13
                                                     257/668
(Continued)

FOREIGN PATENT DOCUMENTS

CN        1526162 A      9/2004
CN      101080800 A     11/2007
(Continued)

OTHER PUBLICATIONS

Mu, Qianli et al., "PCB Based Semiconductor Package Having Integrated Electrical Functionality", U.S. Appl. No. 14/811,325, filed Jul. 28, 2015.

*Primary Examiner* — Jaehwan Oh
(74) *Attorney, Agent, or Firm* — Murphy, Bilak & Homiller, PLLC

(57) ABSTRACT

A semiconductor package includes a metal baseplate having a die attach region and a peripheral region, a transistor die having a reference terminal attached to the die attach region and an RF terminal facing away from the baseplate, and a multilayer circuit board having a first side attached to the peripheral region and a second side facing away from the baseplate. The multilayer circuit board includes two embedded electrically conductive layers that are separated from the first and second sides by layers of composite fiber, and an embedded dielectric layer disposed between the two embedded electrically conductive layers. The embedded dielectric layer has a higher dielectric constant than the layers of composite fiber.

19 Claims, 13 Drawing Sheets

(51) Int. Cl.
*H01L 23/498* (2006.01)
*H05K 1/03* (2006.01)
*H05K 1/11* (2006.01)
*H05K 1/18* (2006.01)
*H01L 23/13* (2006.01)
*H01L 23/66* (2006.01)
*H05K 1/16* (2006.01)

(52) U.S. Cl.
CPC ............ *H05K 1/111* (2013.01); *H05K 1/115* (2013.01); *H05K 1/162* (2013.01); *H05K 1/183* (2013.01); *H01L 2223/6627* (2013.01); *H01L 2223/6655* (2013.01); *H01L 2224/49111* (2013.01); *H01L 2224/49175* (2013.01); *H05K 2201/1003* (2013.01); *H05K 2201/10015* (2013.01)

(56) References Cited

U.S. PATENT DOCUMENTS

| | | | |
|---|---|---|---|
| 5,438,478 A | 8/1995 | Kondo et al. | |
| 5,728,248 A | 3/1998 | Weber | |
| 5,776,512 A | 7/1998 | Weber | |
| 5,798,014 A | 8/1998 | Weber | |
| 5,843,808 A | 12/1998 | Karnezos | |
| 5,973,389 A | 10/1999 | Culnane et al. | |
| 6,172,305 B1 * | 1/2001 | Tanahashi | H01L 23/50 174/255 |
| 6,261,868 B1 | 7/2001 | Miller et al. | |
| 6,329,713 B1 | 12/2001 | Farquhar et al. | |
| 6,365,828 B1 * | 4/2002 | Kinoshita | H01L 23/552 174/359 |
| 6,503,821 B2 | 1/2003 | Farquhar et al. | |
| 6,511,866 B1 | 1/2003 | Bregante et al. | |
| 6,691,296 B1 * | 2/2004 | Nakayama | G06F 17/5036 716/122 |
| 7,298,046 B2 | 11/2007 | Venegas et al. | |
| 7,582,964 B2 | 9/2009 | Venegas et al. | |
| 8,013,429 B2 | 9/2011 | Mohammed et al. | |
| 8,907,467 B2 | 12/2014 | Komposch et al. | |
| 2002/0089798 A1 * | 7/2002 | Iwanami | H05K 1/0233 361/32 |
| 2003/0063427 A1 * | 4/2003 | Kunihiro | H01F 17/0006 361/277 |
| 2003/0063453 A1 * | 4/2003 | Kusagaya | H05K 3/4602 361/794 |
| 2003/0151128 A1 | 8/2003 | Kawaguchi | |
| 2004/0012938 A1 | 1/2004 | Sylvester et al. | |
| 2013/0148314 A1 * | 6/2013 | Hirai | H05K 7/06 361/748 |
| 2013/0256858 A1 * | 10/2013 | Komposch | H01L 23/047 257/676 |
| 2013/0299219 A1 * | 11/2013 | Chisaka | H05K 1/0271 174/257 |
| 2014/0028518 A1 * | 1/2014 | Arnold | H01Q 1/526 343/841 |
| 2014/0078702 A1 * | 3/2014 | Mizuno | H01L 23/49822 361/760 |
| 2014/0117495 A1 * | 5/2014 | Li | H05K 1/185 257/531 |
| 2015/0048492 A1 | 2/2015 | Komposch et al. | |
| 2017/0034913 A1 * | 2/2017 | Mu | H05K 1/111 |

FOREIGN PATENT DOCUMENTS

| | | |
|---|---|---|
| CN | 101308727 A | 11/2008 |
| CN | 101553918 A | 10/2009 |
| CN | 101625730 A | 1/2010 |
| CN | 103887264 A | 6/2014 |
| DE | 10223035 A1 | 12/2003 |
| DE | 102010038246 A1 | 8/2011 |
| EP | 0563873 A2 | 10/1993 |
| EP | 2575167 A2 | 4/2013 |
| JP | H10242377 A | 9/1998 |
| JP | 2003179181 A | 6/2003 |
| WO | 03037048 A1 | 5/2003 |

* cited by examiner

PCB BASED SEMICONDUCTOR PACKAGE WITH IMPEDANCE MATCHING NETWORK ELEMENTS INTEGRATED THEREIN

TECHNICAL FIELD

The present application relates to RF power packages, in particular PCB (printed circuit board) based packages for RF power applications.

BACKGROUND

Ceramic air-cavity and plastic air-cavity/overmold packages are widely used for RF/microwave discrete power transistors. Both types of packages provide a reliable and easy-to-handle handle mechanical design. However, ceramic air-cavity and plastic air-cavity/overmold packages are difficult to design in an electrical sense due to their stack-up and predetermined physical dimensions.

RF transistors are commonly packaged with input and output matching networks. These input and output matching networks are typically provided by discrete reactive components, i.e., capacitors and inductors. For example, an output matching network for an RF transistor may be provided from a discrete capacitor that is mounted to the package substrate. The RF transistor is connected to the capacitor by inductive bond wires. The parameters of the output matching network can be tailored to match the output impedance of the packaged device to a fixed value (e.g., 50 ohms). In a ceramic open cavity RF package, one common approach for the output matching network is a high pass topology, which is designed to propagate higher frequency signals and to shunt lower frequency signals.

Parasitic capacitances, inductances, and resistances in the conventional input/output matching network configurations described above detrimentally impact the performance and/or power consumption of the packaged RF device. These parasitic effects are attributed to mutual inductance and capacitive coupling between the bond wires and the associated bond pads. High-frequency effects also influence the behaviour of the input/output matching network. The physical arrangement of the bond wires can be altered to mitigate this phenomena, but only with limited success.

SUMMARY

A semiconductor package is disclosed. According to an embodiment, the semiconductor package includes a metal baseplate having a die attach region and a peripheral region, a transistor die having a reference terminal attached to the die attach region and an RF terminal facing away from the baseplate, and a multilayer circuit board having a first side attached to the peripheral region and a second side facing away from the baseplate. The multilayer circuit board includes two embedded electrically conductive layers that are separated from the first and second sides by layers of composite fiber, and an embedded dielectric layer disposed between the two embedded electrically conductive layers. The embedded dielectric layer has a higher dielectric constant than the layers of composite fiber.

A semiconductor assembly is disclosed. According to an embodiment, the semiconductor assembly includes a metal baseplate having a die attach region and a peripheral region, a transistor die having a reference terminal attached to the die attach region and an RF terminal facing away from the baseplate, a global printed circuit board, and a multilayer circuit board having a first side attached to the peripheral region and a second side facing away from the baseplate. The multilayer circuit board includes two embedded electrically conductive layers that are separated from the first and second sides by layers of composite fiber, an embedded dielectric layer disposed between the two embedded electrically conductive layers, and an RF impedance matching network having one or more reactive components formed in one of the two embedded electrically conductive layers. The embedded dielectric layer has a higher dielectric constant than the embedded electrically conductive layers. The multilayer circuit board connects the RF terminal of the transistor die to the global printed circuit board.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates partial cross-sectional views of a multilayer circuit board, according to an embodiment.

DETAILED DESCRIPTION

U.S. application Ser. No. 14/811,325 to Mu, which is incorporated by reference in its entirety, describes various embodiments of a package design for, e.g., RF power transistors. To briefly summarize these embodiments, the package design is treated as part of the electrical design of the system instead of a just a mechanical component. To this end, the package includes a multilayer printed circuit board. The multi-layer circuit board can include a minimum of four layers, two of which are ground layers and two of which are signal layers. The signal and ground layers can be interleaved with one another to reduce interference and improve performance. Various RF components can be embedded within the multi-layer circuit board using the embedded signal layer. Examples of these RF components include integrated harmonics resonators, balanced power combiner networks, etc. In this way, fewer external components are needed and space efficiency of the package is improved.

Embodiments of a multilayer circuit board described herein include an embedded dielectric layer that is disposed between embedded signal and ground layers. This design allows for the formation of embedded RF components with advantageous electrical characteristics. The embedded dielectric layer has a substantially higher dielectric constant than typical PCB materials that are used to separate and insulate the various layers. For example, the embedded dielectric layer may be formed from a polymer laminate material with a dielectric constant of between 4 and 30 and a thickness from 2 µm to 24 µm. By way of comparison, typical PCB dielectric layers, have a dielectric constant of 3.7 and a typical minimum thickness of 100 µm. As a result, the performance and/or space utilization of the integrated RF components formed in the presently disclosed multilayer circuit board compares favorably to the RF components that are formed using typical PCB dielectric layers. According to one embodiment, an embedded capacitor with a capacitance value of at least 100 pF (picofarads) is formed in the multilayer circuit board. A capacitor of this magnitude is not achievable using conventionally known PCB materials (e.g., composite fiber) as the interlayer dielectric while maintaining typical package size constraints, e.g., 10 mm×7 mm.

Figure 1:
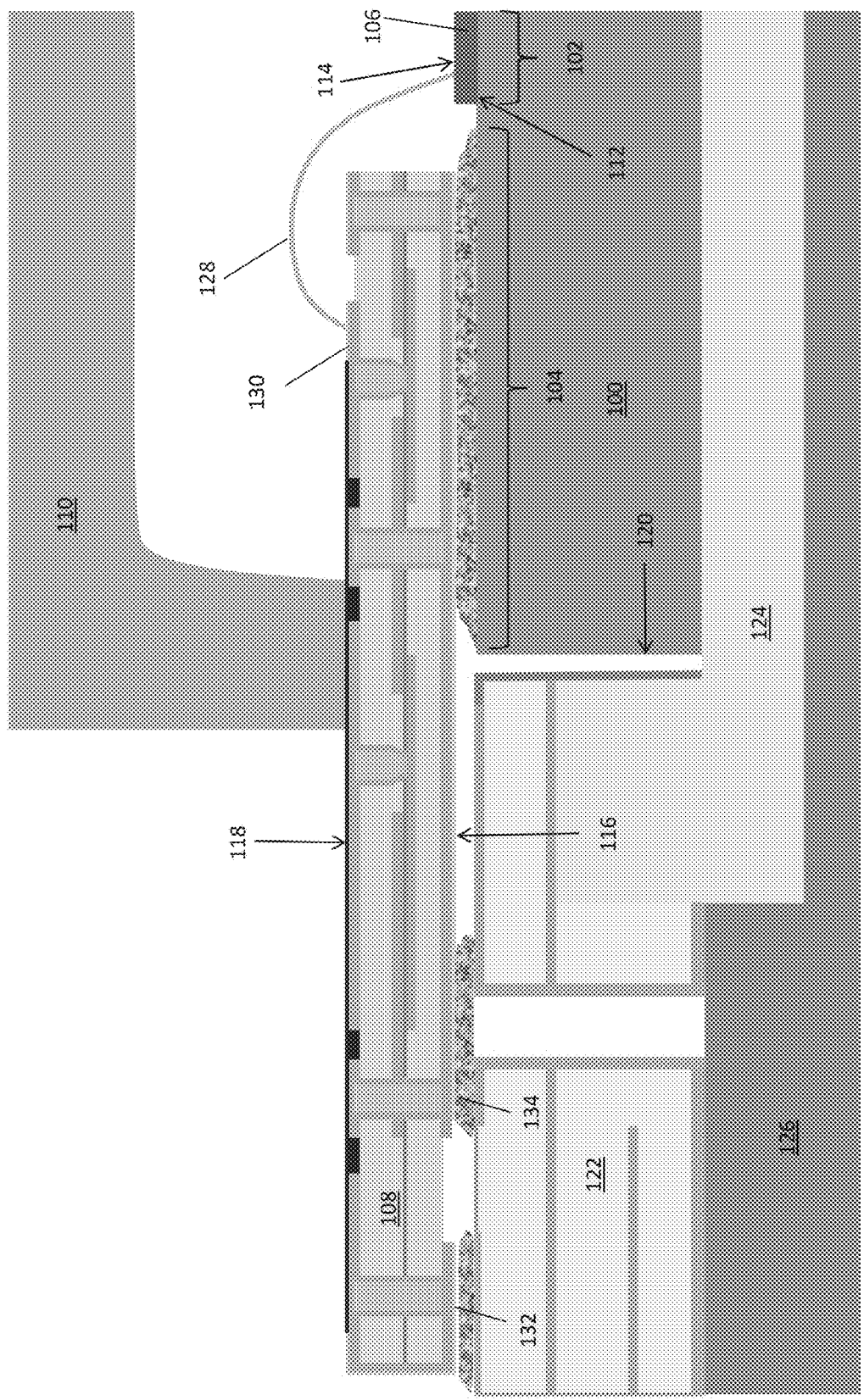
FIG. 1 illustrates a partial sectional view of a semiconductor package including a multilayer circuit board, according to an embodiment.

FIG. 1 illustrates a partial sectional view of a semiconductor package, according to an embodiment. The semiconductor package includes a metal baseplate 100 having a die attach region 102 and a peripheral region 104, a transistor die 106 attached to the die attach region 102 of the baseplate 100, a multilayer circuit board 108 such as a PCB for providing electrical connections to the transistor die 106, and an optional lid 110 for enclosing the transistor die 106. The baseplate 100 is made of an electrically and thermally conductive material such as Cu, CPC (copper, copper-molybendum, copper laminate structure), CuW, etc. In some cases, the transistor die 106 attached to the baseplate 100 is a power transistor die such as an RF amplifier die. For example, the transistor die 106 can be an LDMOS (laterally diffused metal oxide semiconductor), vertical power MOS-FET (metal oxide semiconductor field effect transistor) or GaN RF power transistor die. The transistor die 106 has a reference terminal 112 such as a source or emitter terminal attached to the die attach region 102 and an RF terminal 114 such as a drain or collector terminal facing away from the baseplate 100. The control (gate) terminal of the transistor die is out of view in FIG. 1. More than one transistor die can be attached to the baseplate 100, e.g., in the case of a Doherty amplifier in which a main and one or more peaking amplifiers can be attached to the baseplate 100.

The multilayer circuit board 108 has a first side 116 attached to the peripheral region 104 of the baseplate 100 and a second side 118 facing away from the baseplate 100. The multilayer circuit board 108 extends beyond an exterior sidewall 120 of the baseplate 100 for attachment to another circuit board 122.

The semiconductor package is connected to a global printed circuit board 122. The global printed circuit board 122 is part of a sub-system or system that incorporates the semiconductor package as a constituent component. Other semiconductor devices that are part of this sub-system or system can be connected to the global printed circuit board 122 as well. This global printed circuit board 122 can have a recessed region for receiving the baseplate 100 of the semiconductor package. A metal slug 124 can be disposed in the recess for enhancing the thermal and electrical conduction between the global printed circuit board 122 and the multilayer circuit board 108. The global printed circuit board 122 may include a heatsink 126 containing aluminium or copper, for example, which attaches to the baseplate 100 of the semiconductor package.

The RF terminal 114 of the transistor die 106 is electrically connected to the multilayer circuit board 108, which in turn is connected to the global printed circuit board 122. As shown in FIG. 1, an electrically conductive bond wire 128 forms a direct electrical connection between the RF terminal 114 of the transistor die 106 and a first bond pad 130 that is disposed on the second side 118 of the multilayer circuit board 108. The multilayer circuit board 108 further includes two pads 132, 134 disposed on the first side of the 116. The first pad 132 directly faces and electrically connects to a signal pad of the global printed circuit board 122, and thus forms a signal connection between the two. The second pad 134 directly faces and electrically connects to a ground pad of the global printed circuit board 122 (as well as the baseplate 100), and thus forms a ground connection between the two. The multilayer circuit board 108 contains conductive signal layers and via structures that connect the first bond pad 130 and the second bond pad 132. Using these conductive layers, the multilayer circuit board 108 connects the RF terminal 114 of the transistor die 106 to the global printed circuit board 122. Moreover, an RF impedance matching network can be embedded in the multilayer circuit board 108 and coupled to the RF terminal 114 of the transistor die 106 so as to match the impedance of the packaged device to a desired value (e.g., 50 ohms).

Figure 2:
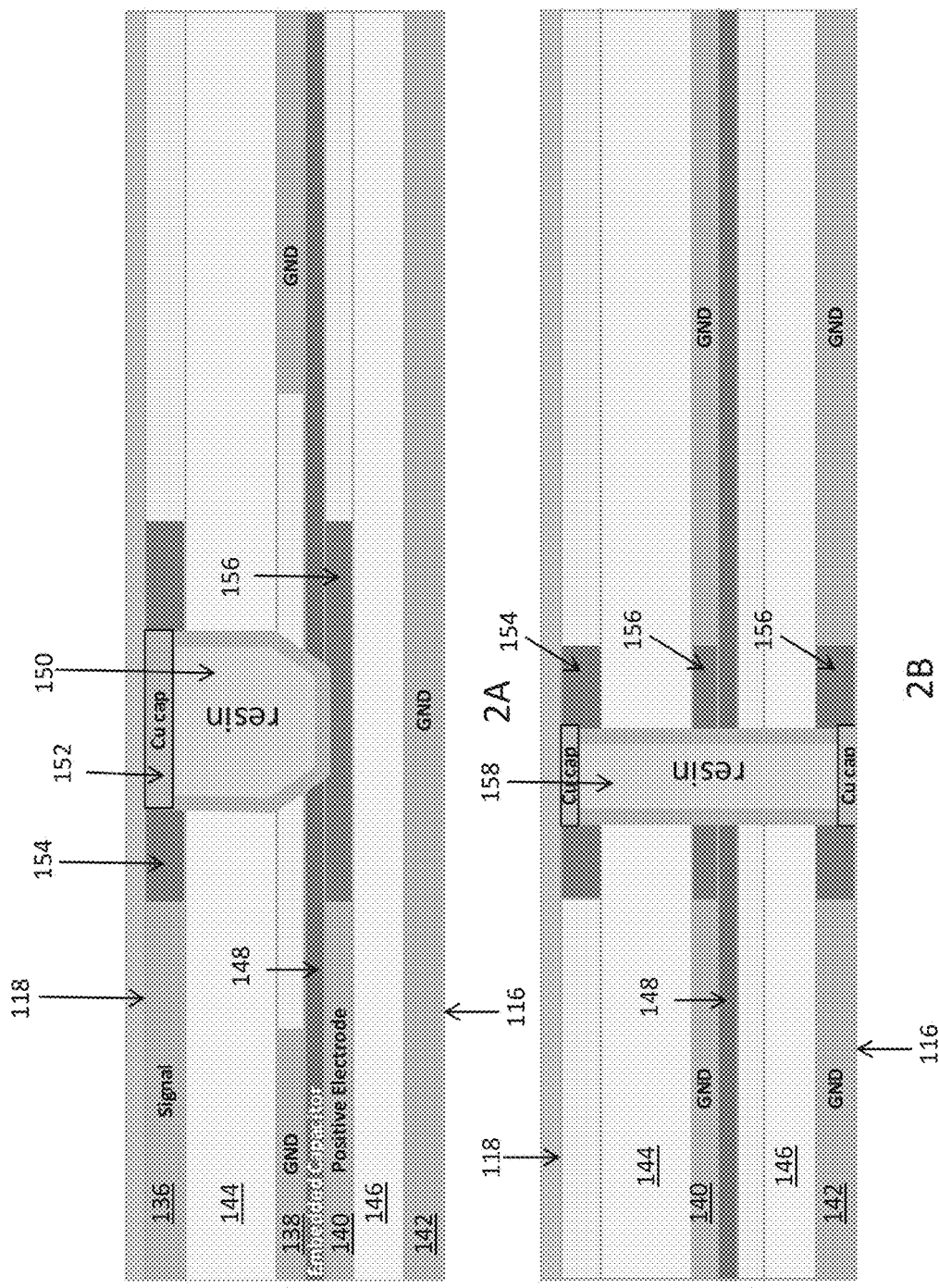
FIG. 2, which includes

Referring to FIGS. 2A and 2B, the interior structure of the multilayer circuit board 108 is depicted, according to an embodiment. The multilayer circuit board 108 includes a number of conductive layers. According to an embodiment, the multilayer circuit board 108 has four electrically conductive layers: a first signal layer 136; a first ground layer 138; a second signal layer 140; and a second ground layer 142. Each of these layers is formed from a standard conductive material, such as copper. The first signal layer 136 is disposed at the second side 118 of the multilayer circuit board 108 and the second ground layer 142 is disposed at the first side 116 of the multilayer circuit board 108. That is, the first signal layer 136 and the second ground layer 142 are disposed at outer, opposing sides of the multilayer circuit board 108. As used herein, "disposed at the first side" or "disposed at the second side," as the case may be, refers to the fact that outer side of the particular element is coextensive with the first or second side of the multilayer circuit board.

The first ground layer 138 and the second signal layer 140 are embedded in the multilayer circuit board. As used herein, "embedded" refers to the fact that the particular element is incorporated into the structure of the multilayer circuit board 108 and is separated from both the first side 116 and the second side 118 by another element or layer. According to an embodiment, the multilayer circuit board 108 includes a first embedded layer 144 disposed between the first signal layer 136 and the first ground layer 138. The first embedded layer 144 and the first signal layer 136 separate the first ground layer 138 from the second surface 118. Likewise, the multilayer circuit board 108 includes a second embedded layer 146 disposed between the second signal layer 140 and the second ground layer 142. The second embedded layer 146 and the second ground layer 142 separate the second signal layer 140 from the first surface 116. According to an embodiment, the first embedded layer 144 and the second embedded layer 146 are formed from an insulative pre-impregnated composite fiber material, such as polytetrafluoroethylene, FR-1, FR-2, FR-3, FR-4, FR-5, FR-6, G-10, CEM-1, CEM-2, CEM-3, CEM-4, CEM-5, etc. The first and second embedded layers 144, 146 have a thickness of at least 75 μm and according to one embodiment, have a thickness of about 100 μm.

The multilayer circuit board 108 further includes an embedded dielectric layer 148 disposed between the first ground layer 138 and the second signal layer 140. The first ground layer 138 and the second signal layer 140 are thus arranged in a parallel plate-capacitor configuration. According to an embodiment, the embedded dielectric layer 148 directly contacts the first ground layer 138 and the second signal layer 140.

The capacitance (C) of a parallel plate-capacitor is given by equation 1 as follows:

$$C = \varepsilon_0 \varepsilon_r \frac{A}{t}, \quad (1)$$

where $\varepsilon_0$=vacuum permittivity, $\varepsilon_r$=relative permittivity of the dielectric, A=plate area, and t=thickness of the dielectric.

Applying equation 1, a package designer can form a parallel plate-capacitor from a section of the of the second signal layer 140 by defining a certain area of the second signal layer 140 to achieve a certain capacitance value. The other parameters of the equation, i.e., relative permittivity of the dielectric and thickness of the dielectric are fixed values that are dictated by the structure of the multilayer circuit board 108. According to an embodiment, the embedded dielectric layer 148 is formed from a polymer capacitance laminate material with a high dielectric constant, e.g., between 4 and 30, and more particularly above 10 in some embodiments. The embedded dielectric layer 148 may have a thickness of between 2 μm and 50 μm, and more particularly between 2 μm and 24 μm is some embodiments.

The multilayer circuit board 108 also includes via structures for connecting and/or providing electrical access to various components. More particularly, FIG. 2A depicts an insulated signal via 150 for connecting sections of the first and second signal layers 136, 140 together. The insulated signal via 150 extends through the first embedded layer 144. Similar structures can be used to connect any two layers together. The insulated signal via 150 may include a cap 152 such as a copper cap in the case of a copper via and a top pad 154 adjacent the cap 152 in the first (uppermost) signal layer 136. The bottom of the insulated signal via 150 includes a conductive pad 156 that contacts a portion of the second signal layer 140.

FIG. 2B illustrates a sectional view of an insulated path via 158 that extends from the first side 116 to the second side 118 and extends through all of the layers disposed between. The insulated path via 158 electrically contacts the second ground layer 142 by a conductive pad 156 and the first ground layer 140 by another conductive pad 156. The insulated path via 158 extends to the second side 118 in a region of the multilayer circuit board 108 that is a devoid of the first signal layer 136. As a result, the first and second ground layers 140, 142 are connected together and are electrically accessible at the second side 118 of the multilayer circuit board 108 by one of the conductive pads 156. A ground terminal of the multilayer circuit board 108 can be formed by the caps 220 on both sides of the multilayer circuit board 108.

Figure 3:
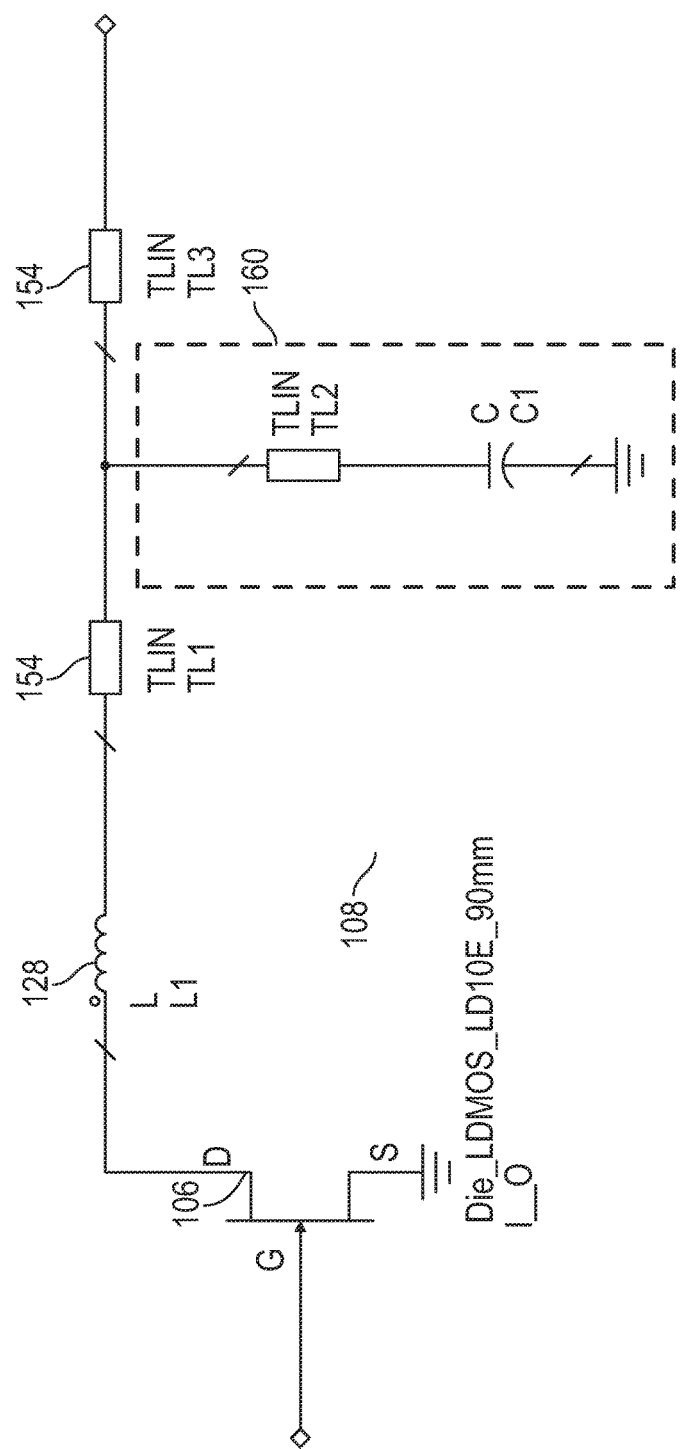
FIG. 3 illustrates a circuit topology for a semiconductor package with a high-pass output matching network, according to an embodiment.

Referring to FIG. 3, an exemplary circuit topology is depicted. The circuit includes the transistor die 106 previously discussed with reference to FIG. 1. The drain terminal of the transistor die 106 is electrically connected to the multilayer circuit board 108 by the electrically conductive bond wire 128 previously discussed with reference to FIG. 1. The bond wire 128 connects to a first bond pad 154 of the multilayer circuit board 108, which may be formed in the first signal layer 136 and is represented by a first transmission line TL1 in the circuit schematic.

The bond wire 128 is connected, via the first bond pad 154, to a shunt LC network 160 that is provided by the multilayer circuit board 108. The shunt LC network 160 includes reactive components that are configured to transform the output impedance of the circuit to a desired matching value (e.g., 50 ohms). The shunt LC network 160 includes a second transmission line TL2, which schematically represents one of the insulated signal vias 150 previously described. The second transmission line TL2 electrically connects the first transmission line TL1 (i.e., the top level bond pad) to an embedded reactive component that is integrated in multilayer circuit board 108. According to an embodiment, this embedded reactive component is an embedded capacitor C1. The positive electrode of the embedded capacitor C1 is formed by a first isolated section of the second signal layer 140, and the ground electrode of the first capacitor is formed by a first isolated section of the first ground layer 138. The embedded dielectric layer 148 is disposed between the two electrodes, i.e., so as to form a parallel plate capacitor described with reference to FIG. 2.

The first transmission line TL1 and the second transmission line TL2 are connected to a third transmission line TL3, which may be provided by another isolated section of the first signal layer 136. The third transmission line TL3 connects to a package terminal, which in turn may be connected to the global circuit board 122 described with reference to FIG. 1.

Figure 4:
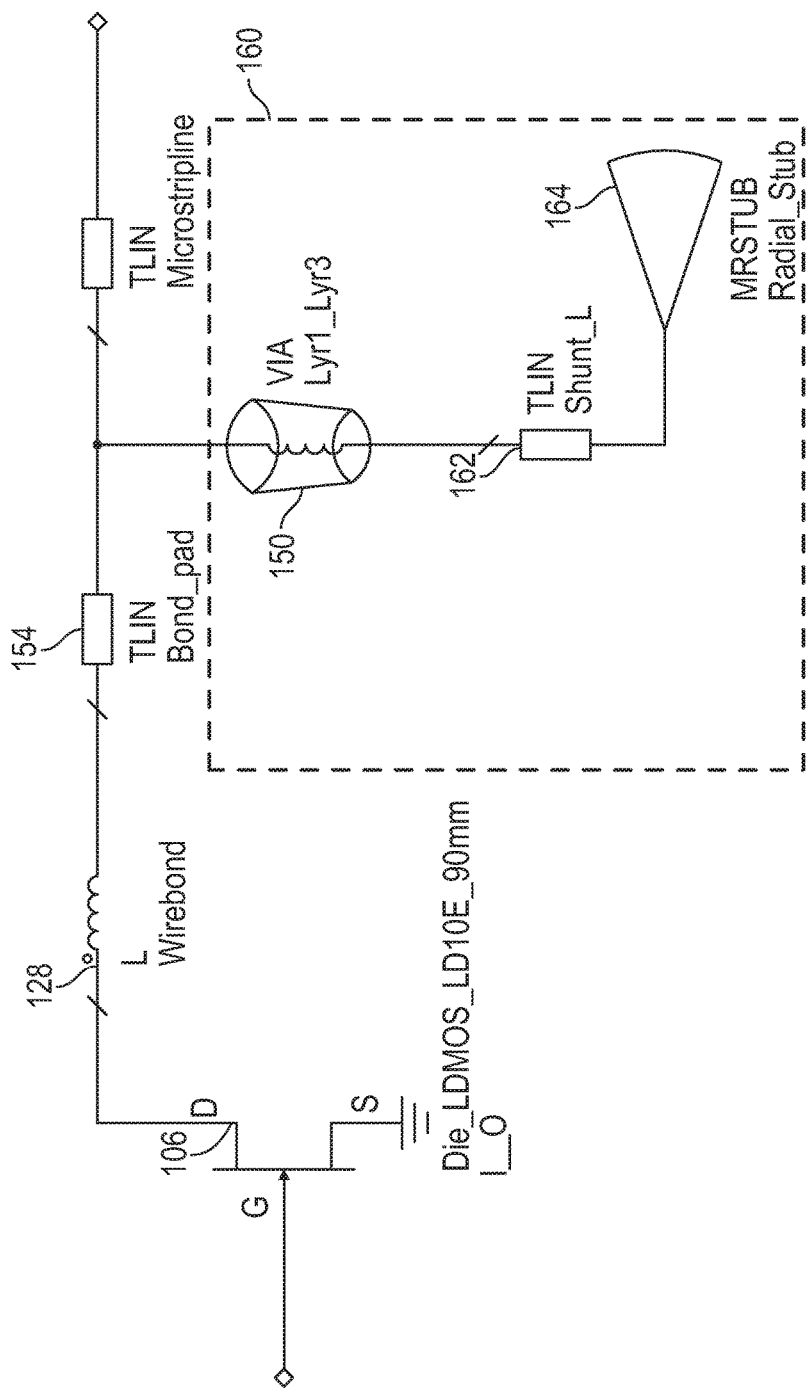
FIG. 4 illustrates a circuit topology for a semiconductor package with a high-pass output matching network, according to another embodiment.

Referring to FIG. 4, an exemplary circuit topology is depicted, according to another embodiment. The circuit topology of FIG. 4 may be substantially similar or identical to that of FIG. 3 with the exception that the shunt LC network 160 is configured with a shunt inductor 162 and a radial stub 164. In the embodiment of FIG. 4, one of the insulated signal vias 150 connects the first transmission line TL1 (i.e., the top level bond pad) to a shunt inductor 162. The shunt inductor 162 may be provided by a linear strip of the second signal layer 140. The shunt inductor 162 connects to an open-circuit radial stub 164.

Figure 5:
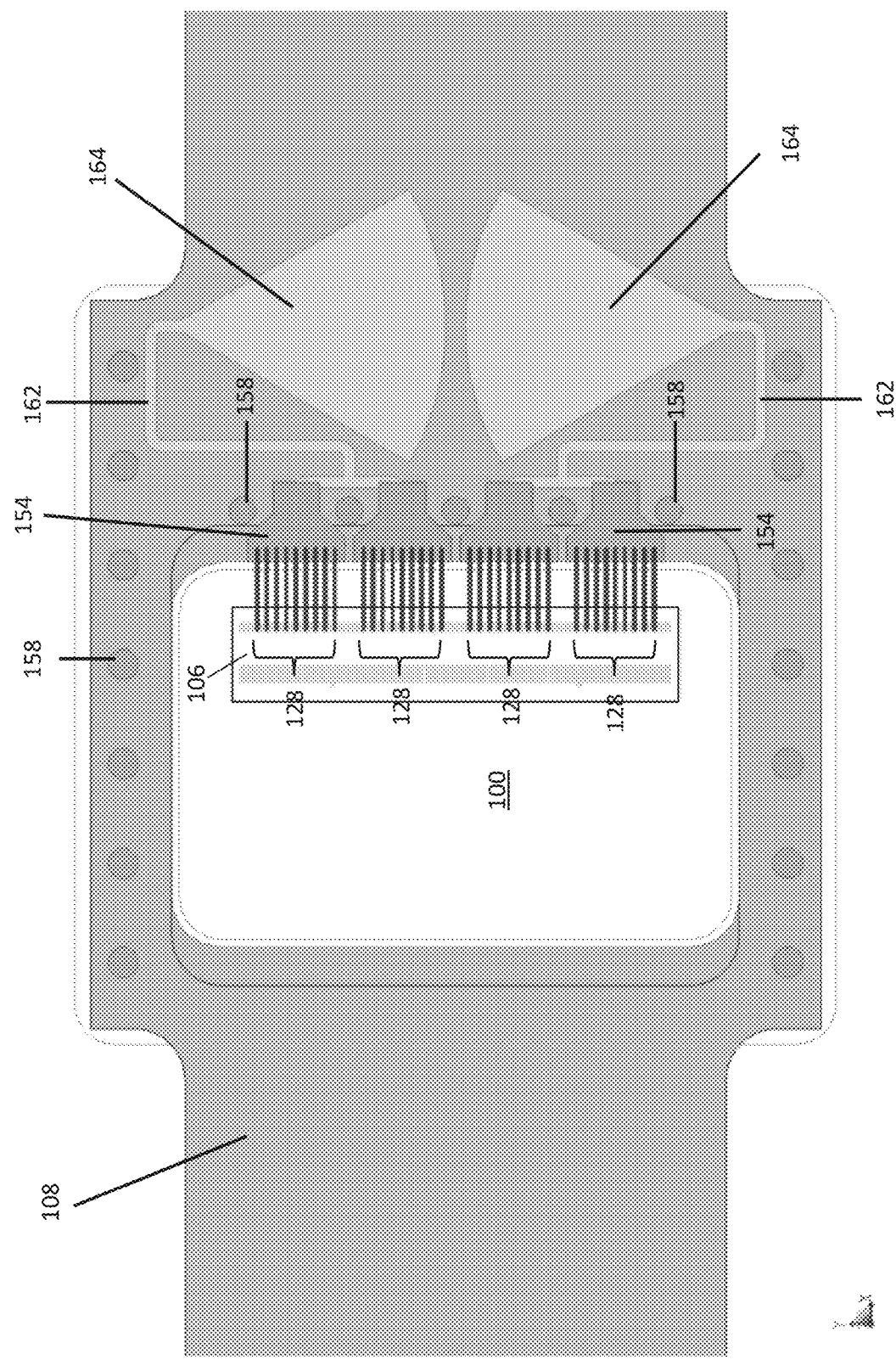
FIG. 5 illustrates a physical layout of the semiconductor package of FIG. 4 with the high-pass output matching network integrated in a multilayer circuit board from a plan-view perspective, according to an embodiment.
Figure 6:
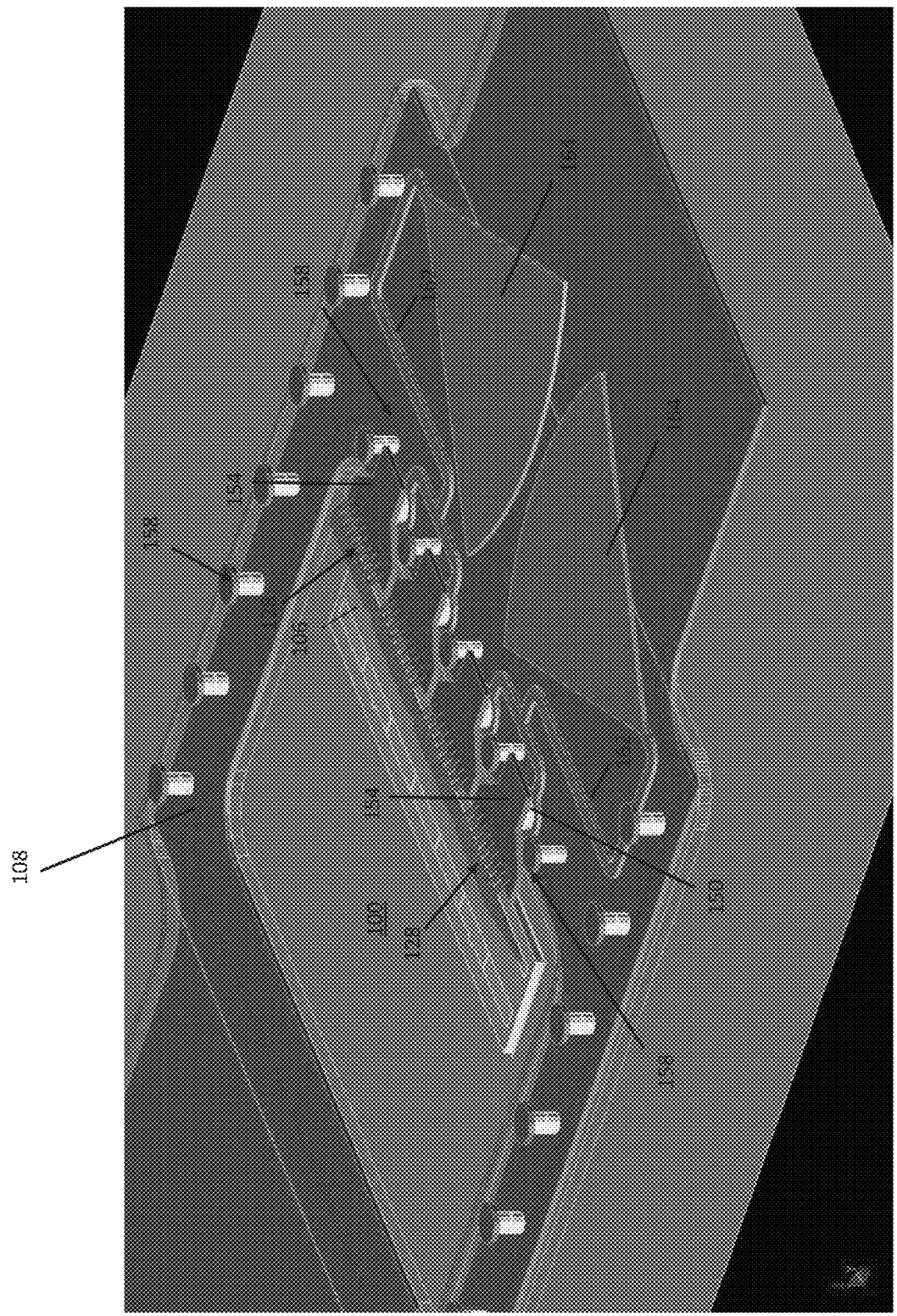
FIG. 6 illustrates a physical layout of the semiconductor package of FIG. 4 with the high-pass output matching network integrated in a multilayer circuit board from an isometric view perspective, according to an embodiment.

Referring FIGS. 5 and 6, a physical layout of the semiconductor package of FIG. 4 is depicted. In the drawings, similarly numbered elements refer to corresponding circuit elements schematically represented in FIG. 4. In the physical layout, a plurality of the bond wires 128 extend directly between the transistor die 106 and a plurality of bond pads 154 that are formed in the first signal layer 136. These bond pads 154 are electrically connected to the second signal layer 140 by insulated signal vias 150. The shunt inductor 162 and the open-circuit radial stub 164 are formed in the second signal layer 140 and connect to the bond pads 154 (and to the bond wires 128) by the insulated signal vias 150. Optionally, the multilayer circuit board 108 may include a plurality of insulated path vias 158 as described with reference to FIG. 2B of the present Specification. These insulated path vias 158 are electrically connected to the ground layers to provide improved electrical isolation.

Generally speaking, radial stubs are used as open-circuit ¼ wave terminations in RF circuits and have enhanced broadband frequency response. In a conventional PCB 2 layer substrate, a radial stub can be formed on the top layer as a microstripline component (i.e., a thin flat conductor which is parallel to a ground plane). However, the relatively low equivalent dielectric constant in this kind of PCB 2 layer substrate means that compact radial stubs are not possible for certain frequency bands. That is, in conventional PCB 2 layer substrates, package area can become the gating factor for the radial stub. The presently configured multilayer circuit board 108 allows for the radial stub 164 to be configured as a stripline component (i.e., a flat strip of metal which is sandwiched between two parallel ground planes) with a relatively compact design. The embedded capacitance material substantially increases the capacitance per unit area of the stripline components and this leads a very compact radial stub layout. For example a layout of 2 mm$^2$ for the embedded component provides a capacitance of 100 pF, and this layout can be easily integrated inside a typical package outline of 10 mm×7 mm (i.e., 70 mm$^2$). With a standard substrate formed from an insulative pre-impregnated composite fiber material, the radial stub layout area needed to achieve 100 pF is 200 mm$^2$, and this size component cannot be integrated within a 10 mm×7 mm package outline.

Figure 7:
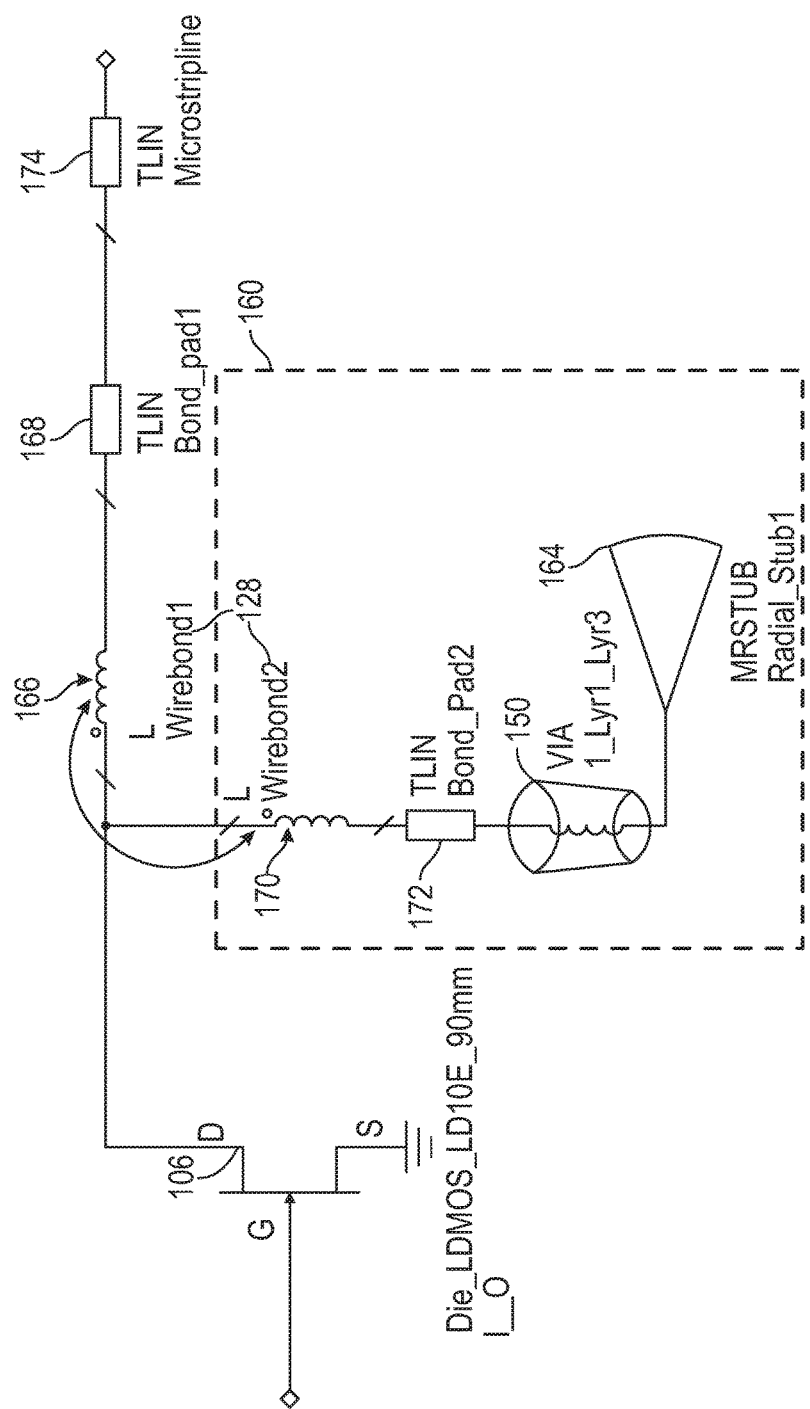
FIG. 7 illustrates a circuit topology for a semiconductor package with a high-pass output matching network, according to another embodiment.

Referring to FIG. 7, an exemplary circuit topology is depicted, according to another embodiment. The circuit of FIG. 7 differs from the circuit of FIG. 4 with respect to the configuration of the bond wires 128. More particularly, the bond wires 128 are configured with two separate branches. A first branch 166 of the bond wires 128 is directly connected between the RF terminal of the transistor die 106 and a first bond pad 168, which may be provided by a first isolated portion of the first signal layer 136 in the manner previously discussed. The first bond pad 168 is connected to an output node of the multilayer circuit board 108 by a length of microstripline 174. A second branch 170 of the bond wires 128 is directly connected between the RF terminal of the transistor die 106 and a second bond pad 172, which may be provided by a second isolated portion of the first signal layer 136 that is electrically disconnected from the first bond pad 168. An insulated signal via 150 connects the second bond pad 172 to the radial stub 164.

Figure 8:
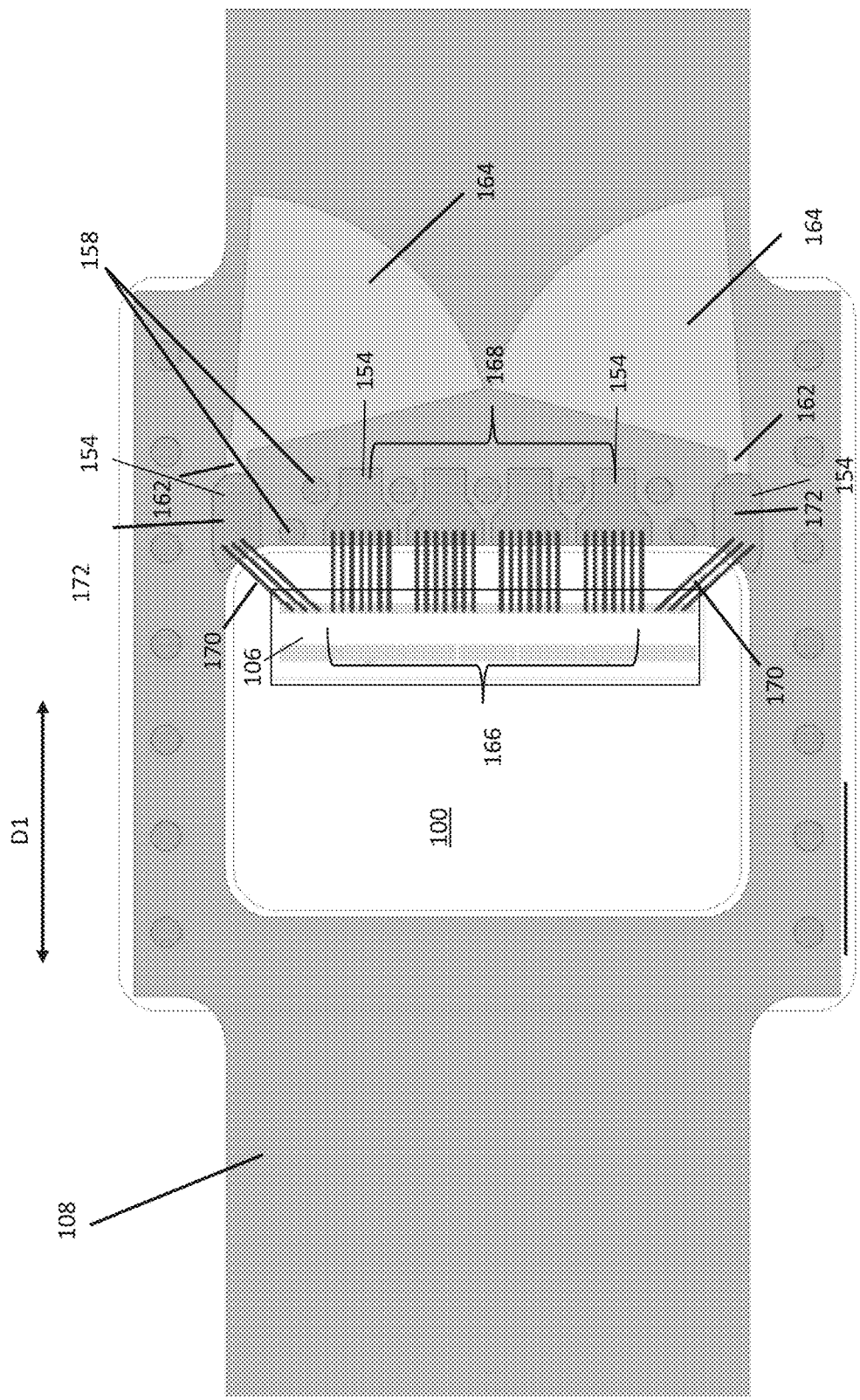
FIG. 8 illustrates a physical layout of the semiconductor package of FIG. 7 with the high-pass output matching network integrated in a multilayer circuit board from a plan-view perspective, according to an embodiment.
Figure 9:
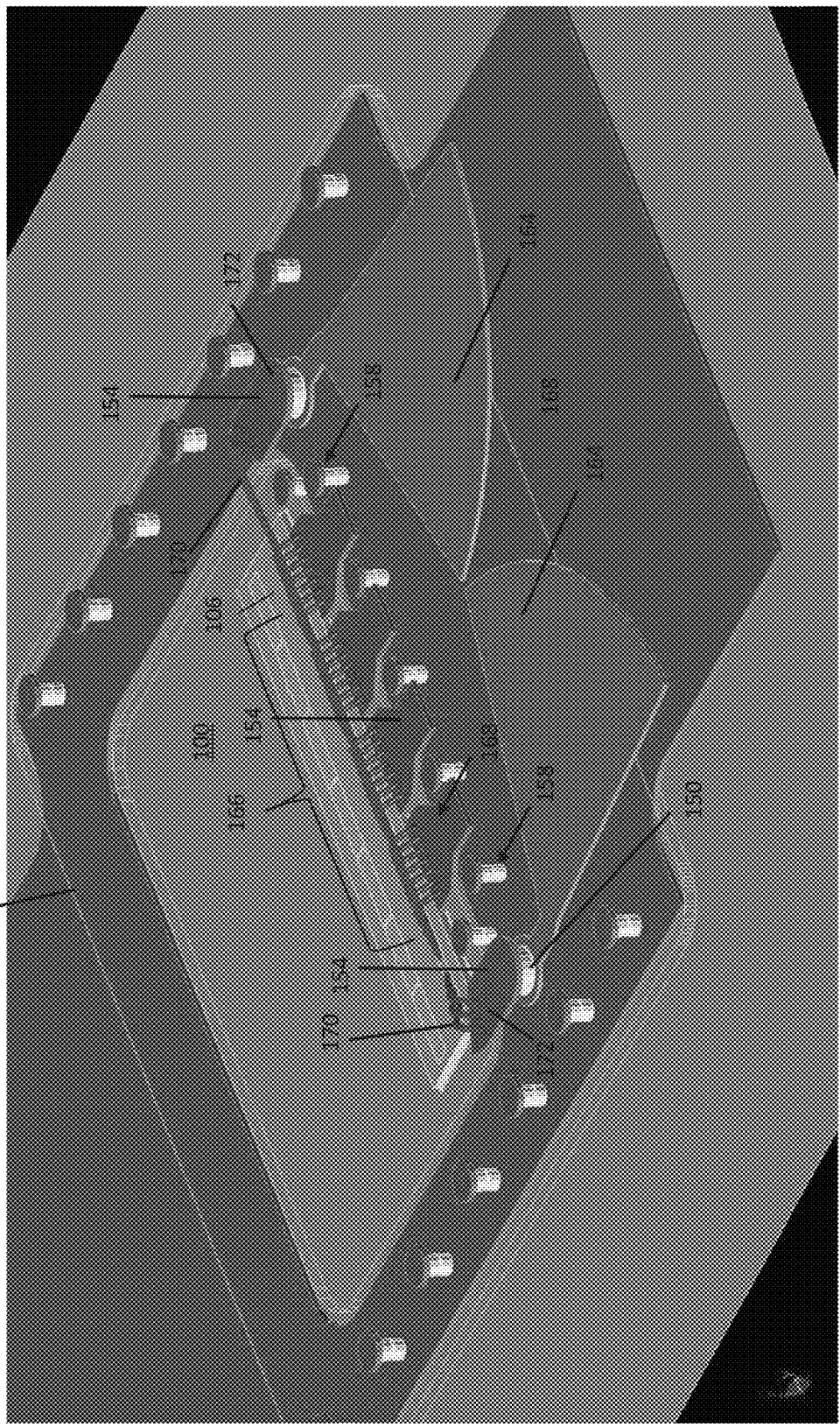
FIG. 9 illustrates a physical layout of the semiconductor package of FIG. 7 with the high-pass output matching network integrated in a multilayer circuit board from an isometric view perspective, according to an embodiment.

Referring FIGS. 8 and 9, a physical layout of the semiconductor package of FIG. 8 is depicted. A set of the first bond pads 168 may be arranged in a similar manner as the bond pads 154 shown in FIGS. 5 and 6. Another set of the second bond pads 172 may be disposed on either side of the first bond pads 168. That is, the first bond pads 168 may be disposed between the second bond pads 172. Optionally, a plurality of insulated path vias 158 that are electrically grounded may be disposed between the first bond pads 168 and the second bond pads 172 to provide increased electrical shielding between the two.

According to an embodiment, the first branch 166 of the bond wires 128 extends in a first direction D1 between the transistor die 106 and the first bond pads 168. From the perspective of FIG. 8, the first direction D1 extends left to right, and represents a direction of the shortest path between the RF terminal 114 of the transistor die 106 and the first bond pads 168. The second branch 170 of the bond wires 128 extends in a second direction that is non-parallel to the first direction. That is, the second direction is disposed at an angle relative first direction. In the embodiment of FIG. 8, the second branch 170 of the bond wires 128 form an acute angle with the first branch 166 of the bond wires 128. This arrangement increases the separation distance between the first and second branches 176, 170 and consequently reduces the mutual inductance between the various bonding wires. As a result, parasitic effects are mitigated. Different orientations may be achieved, depending on the positioning of the bond pads 154.

Figure 10:
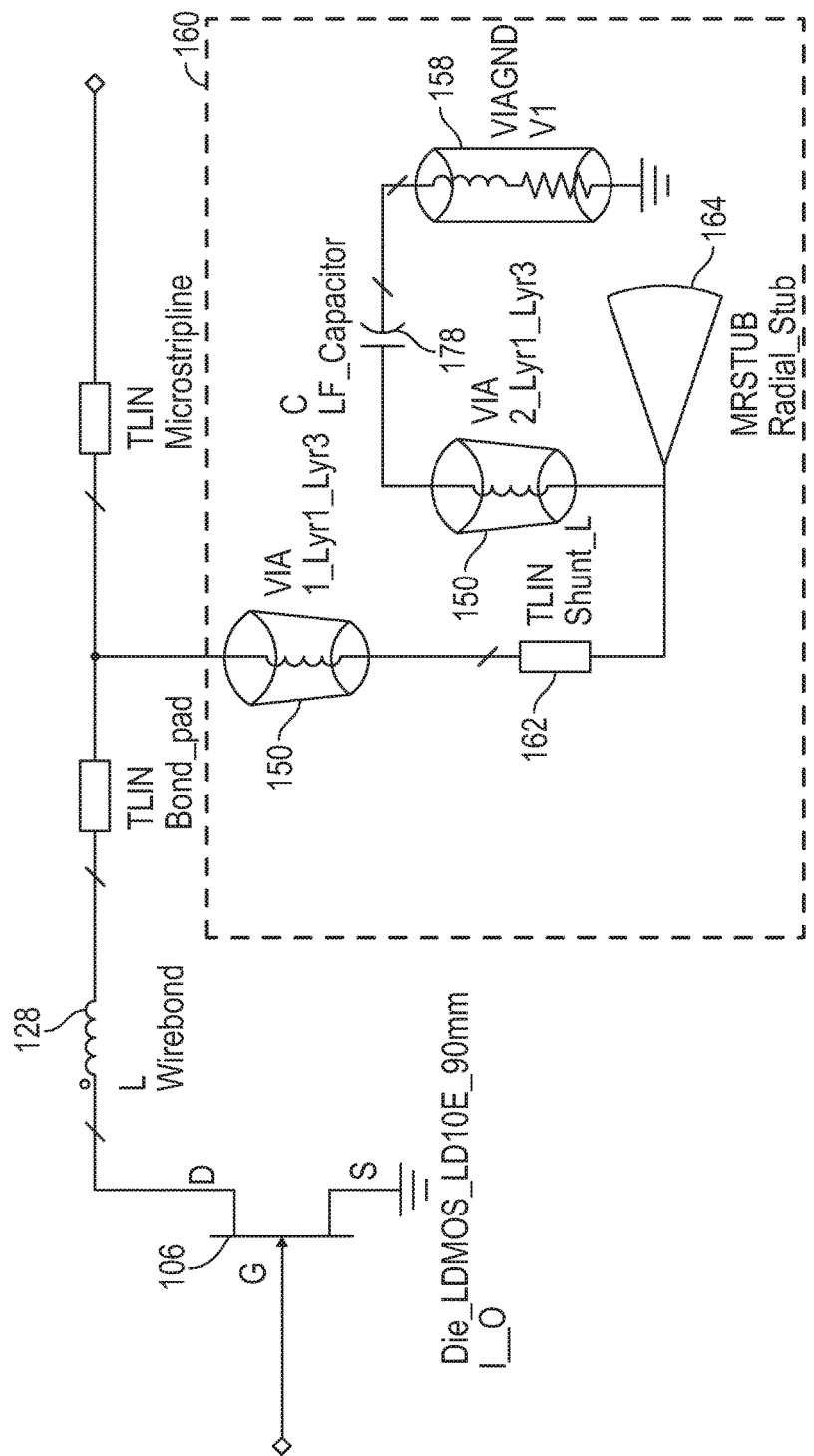
FIG. 10 illustrates a circuit topology for a semiconductor package with a high-pass output matching network and low-frequency termination capacitor, according to an embodiment.

Referring to FIG. 10, an exemplary circuit topology is depicted, according to another embodiment. The circuit of FIG. 10 has a substantially similar topology to the circuit of FIG. 4, with the exception that an additional capacitor 178 is incorporated into the output matching network to improve the linearity of the system by providing a low frequency termination. Conventionally, a low frequency termination capacitor can be provided outside of the package using a discrete component. However, this arrangement suffers from the drawback that the parasitic inductance and capacitance of the external electrical connections (e.g., bond wires) to the additional capacitor degrade the bandwidth of the low frequency termination by as much as 100 MHz to 200 MHz. Preferably, the capacitor is disposed as close to the transistor as possible to mitigate these parasitic effects. Advantageously, the multilayer circuit board 108 design described herein allows for the additional capacitor 178 to be implemented as a discrete capacitor formed on or in the multilayer circuit board 108 very close to the transistor die 106. That is, the low frequency capacitor can incorporated into the device package. As a result, the bandwidth of the low frequency termination is improved.

Figure 11:
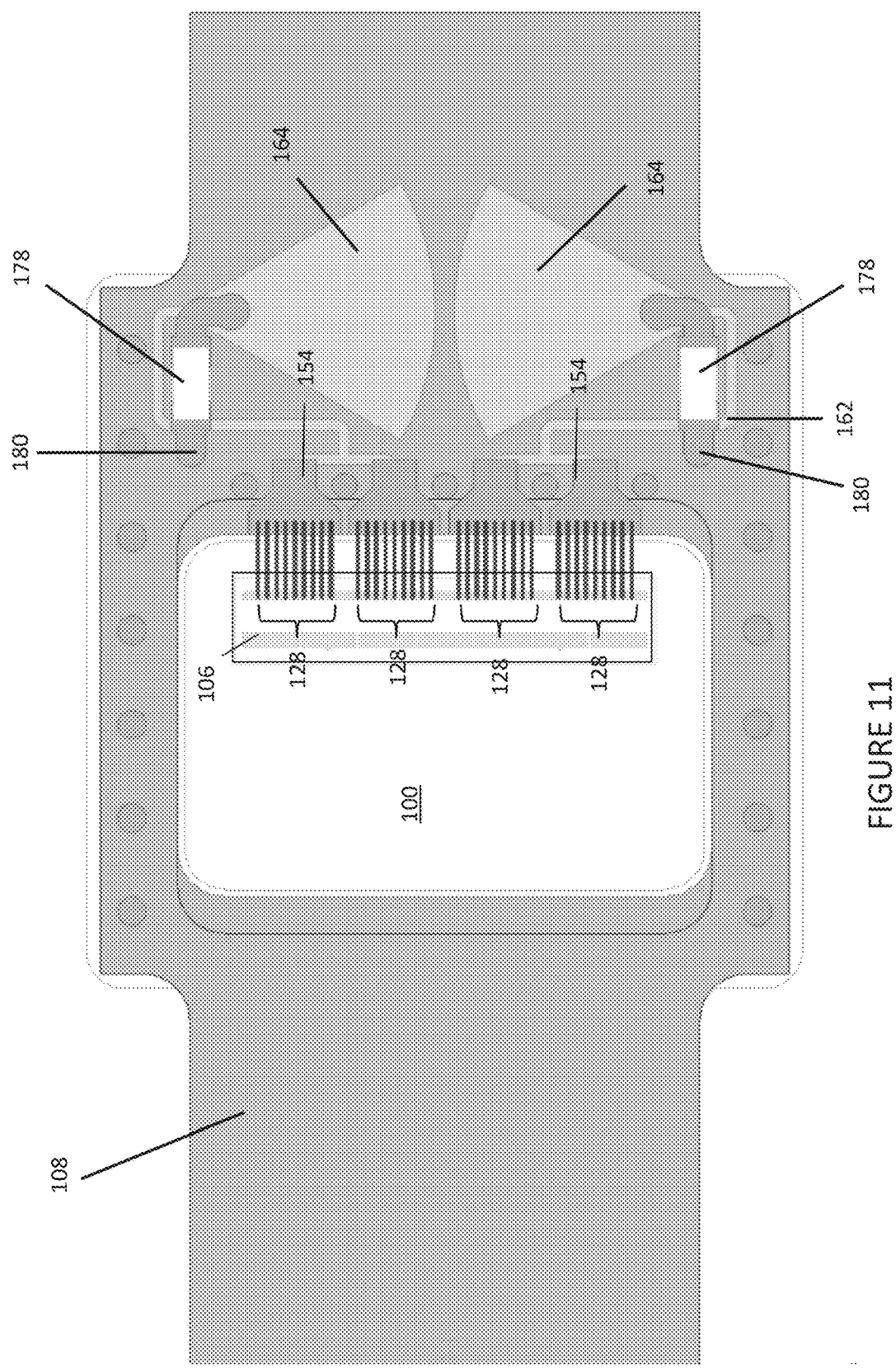
FIG. 11 illustrates a physical layout of the semiconductor package of FIG. 10, with the high-pass output matching network integrated in a multilayer circuit board and a low-frequency termination capacitor mounted to an upper side of the multilayer circuit board, from a plan-view perspective, according to an embodiment.
Figure 12:
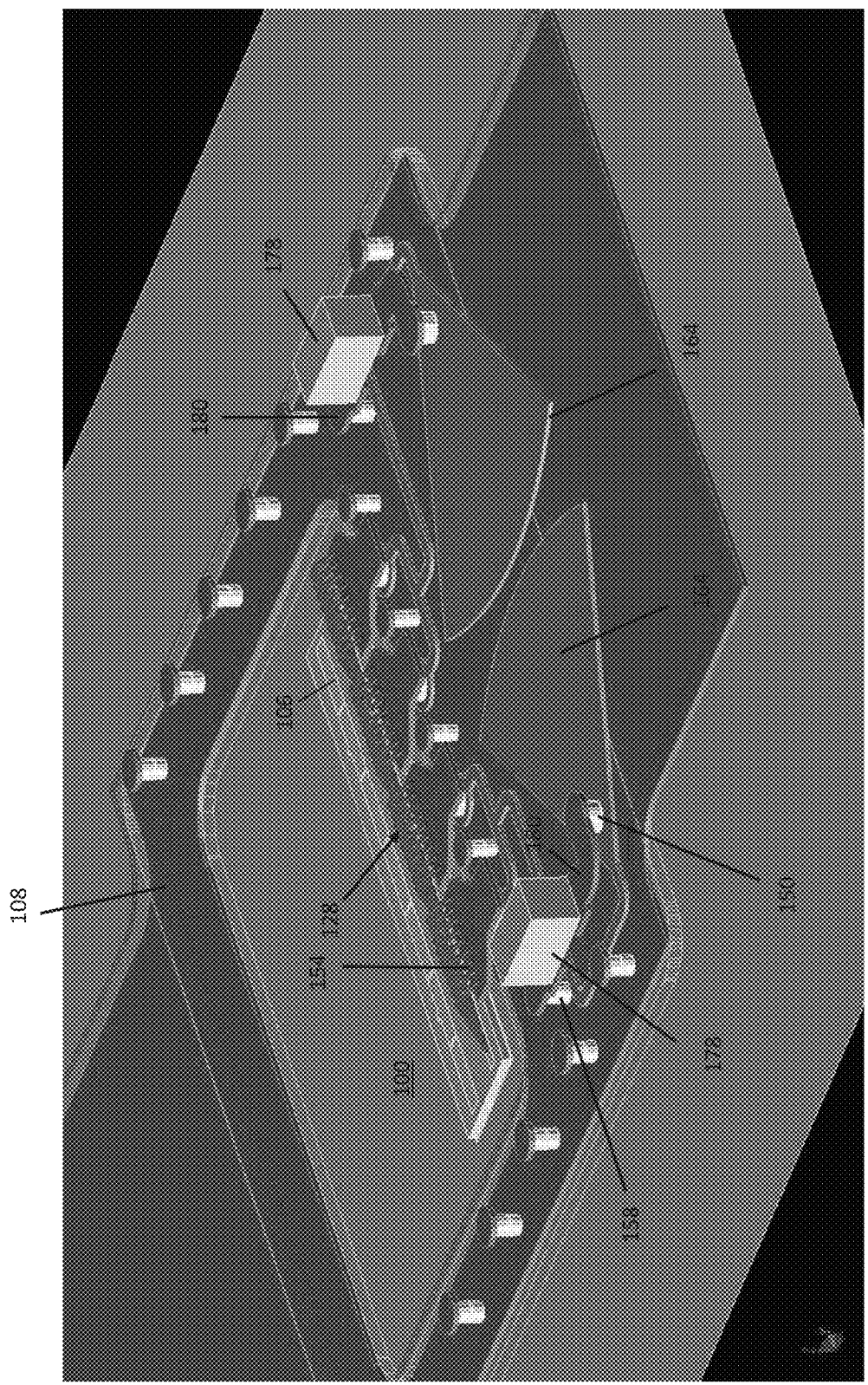
FIG. 12 illustrates a physical layout of the semiconductor package of FIG. 10, with the high-pass output matching network integrated in a multilayer circuit board and a low-frequency termination capacitor mounted to an upper side of the multilayer circuit board, from an isometric view perspective, according to an embodiment.

Referring FIGS. 11 and 12, a physical layout of the semiconductor package of FIG. 10 is depicted. In the embodiment of FIGS. 11 and 12, the additional capacitor 178 is implemented as a surface-mount capacitor, i.e., a discrete capacitor with lower facing terminals that directly contact a bond pad, and is bonded to the second side 118 of the multilayer circuit board 108. The multilayer circuit board includes 108 a third bond pad 180 which is formed by a third isolated portion of the first signal layer 136. The third bond pad 180 is electrically disconnected from the other bond pads 154. A positive electrode of the low frequency termination capacitor 178 is electrically connected to at least one of the embedded reactive components (i.e., the shunt inductor 162 and the radial stub 164 in the embodiment of FIGS. 11-12) by an insulated signal via 150. The negative electrode of the low frequency termination capacitor 178 is connected to electrical ground by one of the path vias 158. Advantageously, the multilayer circuit board 108 described herein provides the circuit topology of FIG. 10 in a space efficient manner by providing the radial stub 164 embedded within the multilayer circuit board 108 while using overlapping surface area on the top surface of the multilayer circuit board 108 for the low frequency termination capacitor 178.

In the embodiment of FIG. 10, the low frequency termination capacitor 178 is combined with the circuit and corresponding layouts described with reference to FIGS. 4-6. However, this is just one example. Alternatively, the low frequency termination capacitor 178 could be combined with different configurations, such as the circuit and corresponding layouts described with reference to FIGS. 7-9.

Figure 13:
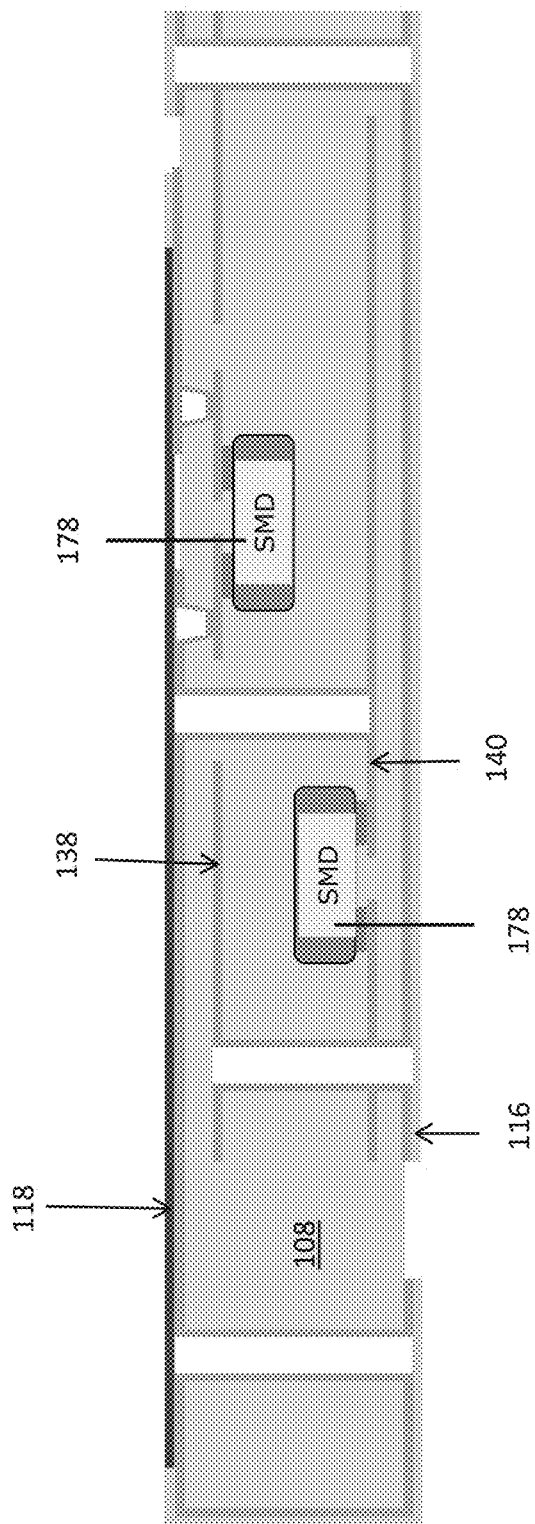
FIG. 13 illustrates a side-view of a multilayer circuit board with a thin surface-mount capacitor embedded within the multilayer circuit board, according to an embodiment.

Referring to FIG. 13, partial sectional view of a multilayer circuit board 108 is depicted, according to an embodiment. The multilayer circuit board 108 may be configured similarly as the multilayer circuit board described with reference to FIGS. 11 and 12, with the exception that the low frequency termination capacitor 178 is disposed inside of the multilayer circuit board 108 instead of on the upper surface. According to an embodiment, the low frequency termination capacitor 178 is an ultra-thin surface mount device. These devices can be embedded into the multilayer circuit board 108 during the fabrication process. More particularly, an ultra-thin surface mount device can be embedded in one or both of the embedded layers 144, 146, during the lamination process that forms these layers. Isolated sections of the signal and/or ground layers can be formed to provide bonding locations for the ultra-thin surface mount device. The insulated signal vias 150 and path vias 158 described herein can be used to connect these bonding locations with external bond pads.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a metal baseplate having a die attach region and a peripheral region;
   a transistor die having a reference terminal attached to the die attach region and an RF terminal facing away from the baseplate; and
   a multilayer circuit board having a first side attached to the peripheral region and a second side facing away from the baseplate, the multilayer circuit board comprising:
      a first embedded electrically conductive layer that is separated from the first side by a first layer of composite fiber;
      a second embedded electrically conductive layer that is separated from the second side by a second layer of composite fiber; and
      an embedded dielectric layer disposed between the first and second embedded electrically conductive layers,
   wherein the embedded dielectric layer has a higher dielectric constant than each of the first and second layers of composite fiber.

2. The semiconductor package of claim 1, wherein the multilayer circuit board comprises:
   a first electrically conductive signal layer disposed at the second side;
   a first electrically conductive ground layer embedded in the multilayer circuit board;
   a second electrically conductive signal layer embedded in the multilayer circuit board;
   a second electrically conductive ground layer disposed at the first side, wherein:
   the first layer of composite fiber separates the first signal layer from the first ground layer,
   the second layer of composite fiber separates the second signal layer from the second ground layer,
   the embedded dielectric layer separates the first ground layer from the second signal layer, and
   the embedded dielectric layer has a lesser thickness than each of the first and second layers of composite fiber.

3. The semiconductor package of claim 2, wherein the embedded dielectric layer has a dielectric constant of between 4 and 30, and wherein the first and second composite fiber layers each have a dielectric constant of 3.7 or less.

4. The semiconductor package of claim 3, wherein the embedded dielectric layer is formed from a polymer laminate material, and wherein the first and second composite fiber layers are formed from at least one of: FR-1, FR-2, FR-3, FR-4, FR-5, FR-6, G-10, CEM-1, CEM-2, CEM-3, CEM-4, CEM-5.

5. The semiconductor package of claim 3, wherein the embedded dielectric layer has a thickness of between 4 μm and 50 μm, and wherein the first and second composite fiber layers each have a thickness of at least 75 μm.

6. The semiconductor package of claim 2, wherein the multilayer circuit board comprises:
   a first electrically conductive via extending through the first composite fiber layer and connected to a first bonding pad, the first bonding pad being formed by an isolated portion of the first signal layer and; and
   one or more embedded reactive components electrically connected to the first via, each of the one or more embedded reactive components comprising an isolated section of the second signal layer.

7. The semiconductor package of claim 6, wherein the one or more embedded reactive components comprise a first capacitor, wherein a positive electrode of the first capacitor is formed by a first isolated section of the second signal layer, and wherein a ground electrode of the first capacitor is formed by a first isolated section of the first ground layer.

8. The semiconductor package of claim 7, wherein the first capacitor has a capacitance of at least 100 picoFarads.

9. The semiconductor package of claim 6, wherein the one or more embedded reactive components comprise:
 a shunt inductance connected to the first electrically conductive via and comprising a linear strip of the second signal layer; and
 an open-circuit radial stub connected to the shunt inductance and comprising a radially shaped section of the second signal layer.

10. The semiconductor package of claim 9, further comprising:
 a first set of bond wires directly connected between the RF terminal and the first bonding pad.

11. The semiconductor package of claim 10, further comprising:
 a second bonding pad formed by an isolated portion of the first signal layer; and
 a second set of bond wires directly connected between the RF terminal and the second bonding pad,
 wherein the first set of bond wires extends in a first direction between the RF terminal and the first bonding pad,
 wherein the second set of bond wires extends in a second direction between the RF terminal and the second bonding pad, and
 wherein the second direction is non-parallel to the first direction.

12. The semiconductor package of claim 6, further comprising a discrete capacitor formed on or in the baseplate and connected to the one or more embedded reactive components.

13. The semiconductor package of claim 12, wherein the multilayer circuit board comprises a third bonding pad formed by an isolated portion of the first signal layer, wherein the discrete capacitor is a surface-mount capacitor that is directly mounted on the third bonding pad, and wherein the third bonding pad is electrically connected to the one or more embedded reactive components by a second electrically conductive via extending through the first composite fiber layer.

14. A semiconductor assembly, comprising:
 a metal baseplate having a die attach region and a peripheral region;
 a transistor die having a reference terminal attached to the die attach region and an RF terminal facing away from the baseplate;
 a global printed circuit board; and
 a multilayer circuit board having a first side attached to the peripheral region and a second side facing away from the baseplate, the multilayer circuit board comprising:
  a first embedded electrically conductive layer that is separated from the first side by a first layer of composite fiber;
  a second embedded electrically conductive layer that is separated from the second side by a second layer of composite fiber; and
  an embedded dielectric layer disposed between the first and second embedded electrically conductive layers;
  an RF impedance matching network comprising one or more reactive components formed from at least one of the embedded electrically conductive layers,
 wherein the embedded dielectric layer has a higher dielectric constant than the first and second layers of composite fiber, and
 wherein the multilayer circuit board connects the RF terminal of the transistor die to the global printed circuit board.

15. The semiconductor assembly of claim 14, wherein the multilayer circuit board comprises:
 a first electrically conductive signal layer disposed at the second side;
 a first electrically conductive ground layer embedded in the multilayer circuit board;
 a second electrically conductive signal layer embedded in the multilayer circuit board;
 a second electrically conductive ground layer disposed at the first side, wherein:
 the first layer of composite fiber separates the first signal layer from the first ground layer,
 the second layer of composite fiber separates the second signal layer from the second ground layer,
 the embedded dielectric layer separates the first ground layer from the second signal layer, and
 the embedded dielectric layer has a lesser thickness than each of the first and second layers of composite fiber.

16. The semiconductor assembly of claim 15, wherein the embedded dielectric layer has a dielectric constant of between 4 and 30, wherein the first and second composite fiber layers each have a dielectric constant of 3.7 or less, wherein the embedded dielectric layer has a thickness of between 4 µm and 50 µm, and wherein the first and second composite fiber layers each have a thickness of at least 75 µm.

17. The semiconductor assembly of claim 16, wherein the multilayer circuit board comprises:
 a first electrically conductive via extending through the first composite fiber layer and connected to a first bonding pad that is formed by an isolated portion of the first signal layer; and
 one or more embedded reactive components electrically connected to the first via, each of the one or more embedded reactive components comprising an isolated section of the second signal layer.

18. The semiconductor assembly of claim 17, wherein the one or more embedded reactive components comprise a first capacitor, wherein a positive electrode of the first capacitor is formed by a first isolated section of the second signal layer, and wherein a ground electrode of the first capacitor is formed by a first isolated section of the first ground layer.

19. The semiconductor assembly of claim 18, wherein the one or more embedded reactive components comprise:
 a shunt inductance connected to the first electrically conductive via and comprising a linear strip of the second signal layer; and
 an open-circuit radial stub connected to the shunt inductance and comprising a radially shaped section of the second signal layer.

* * * * *